United States Patent [19]

Fukushi et al.

[11] Patent Number: 5,124,950
[45] Date of Patent: Jun. 23, 1992

[54] MULTI-PORT SEMICONDUCTOR MEMORY

[75] Inventors: Isao Fukushi; Takashi Ozawa, both of Yokohama, Japan

[73] Assignees: Fujitsu Limited, Kawasaki; Fujitsu VLSI Limited, Kasugai, both of Japan

[21] Appl. No.: 585,891

[22] Filed: Sep. 20, 1990

[51] Int. Cl.$^5$ .............................................. G11C 8/00
[52] U.S. Cl. ......................... 365/230.05; 365/230.01; 365/208
[58] Field of Search ...................... 365/230.03, 189.07, 365/207, 208, 189.04, 230.01, 230.05

[56] References Cited

U.S. PATENT DOCUMENTS 4,586,168  4/1986  Adlhoch et al. ................. 365/156
4,984,204  1/1991  Sato et al. ..................... 365/208 X

FOREIGN PATENT DOCUMENTS 241671  10/1987  European Pat. Off.
1-22093   5/1989  Japan.

Primary Examiner—Joseph A. Popek
Attorney, Agent, or Firm—Staas & Halsey

[57] ABSTRACT

A multi-port semiconductor memory includes a memory cell array having a plurality of memory cells (10), a plurality of columns and rows, a write/read system, and at least one read system having sense amplifiers, each of the columns having a pair of data lines. Each of the sense amplifiers has first and second terminals connected to the pair of data lines and senses a voltage difference between the first and second terminals. The multi-port semiconductor memory also includes an address coincidence detection circuit which generates a control signal when a first address provided for writing write data into the memory cell array by the write/read system coincides with a second address provided for reading the write data by the read system. Further, the multi-port semiconductor memory includes a read control circuit which is provided in each of the sense amplifiers and which connects the first and second terminals of a corresponding one of the sense amplifies to the pair of data lines when the address coincidence detection circuit generates no control signal and which sets one of the first and second terminals to a predetermined voltage on the basis of the content of the write data while the other one of the first and second terminals is connected to a corresponding one of the pair of data lines.

15 Claims, 10 Drawing Sheets

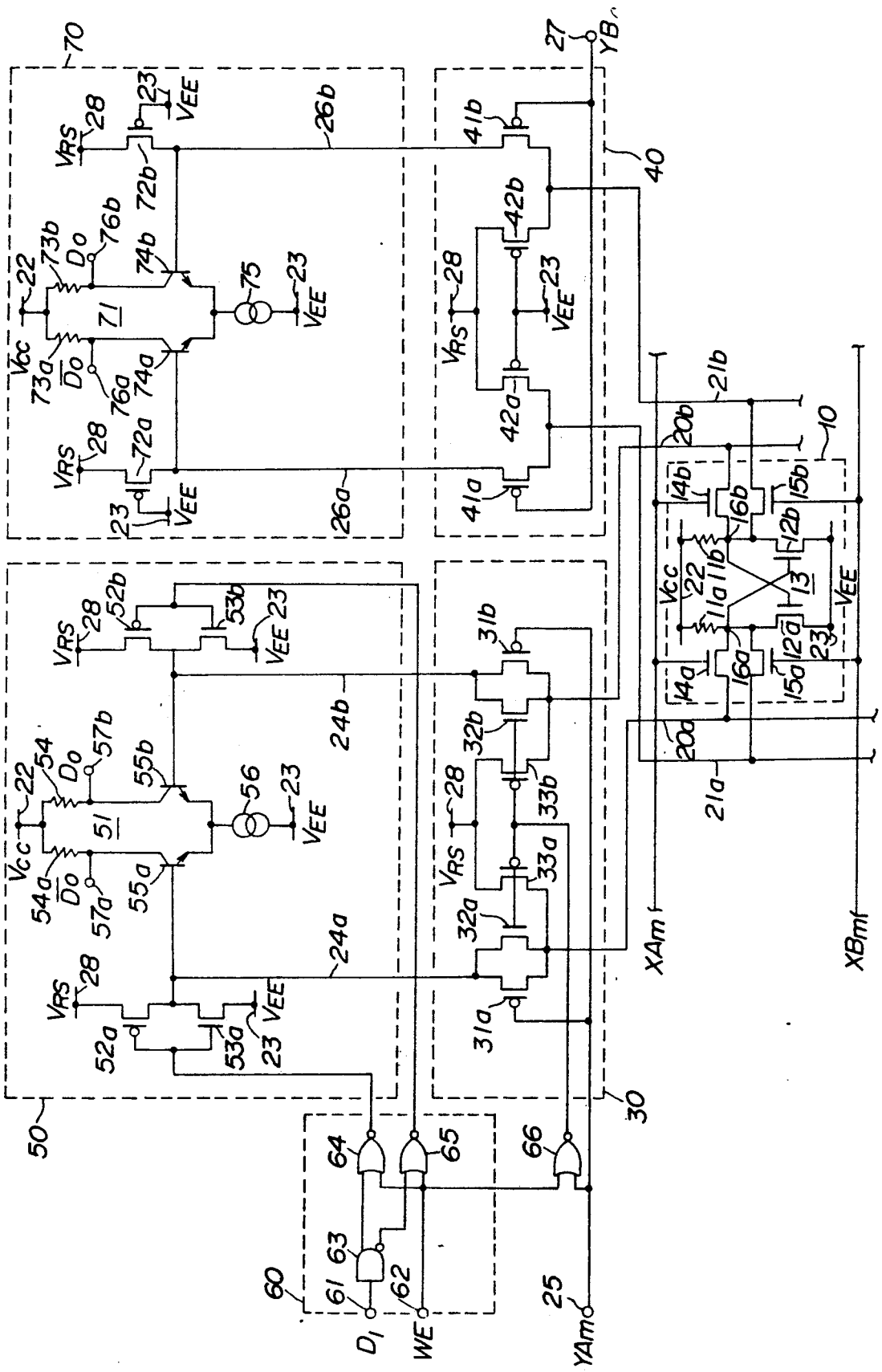
FIG. I PRIOR ART

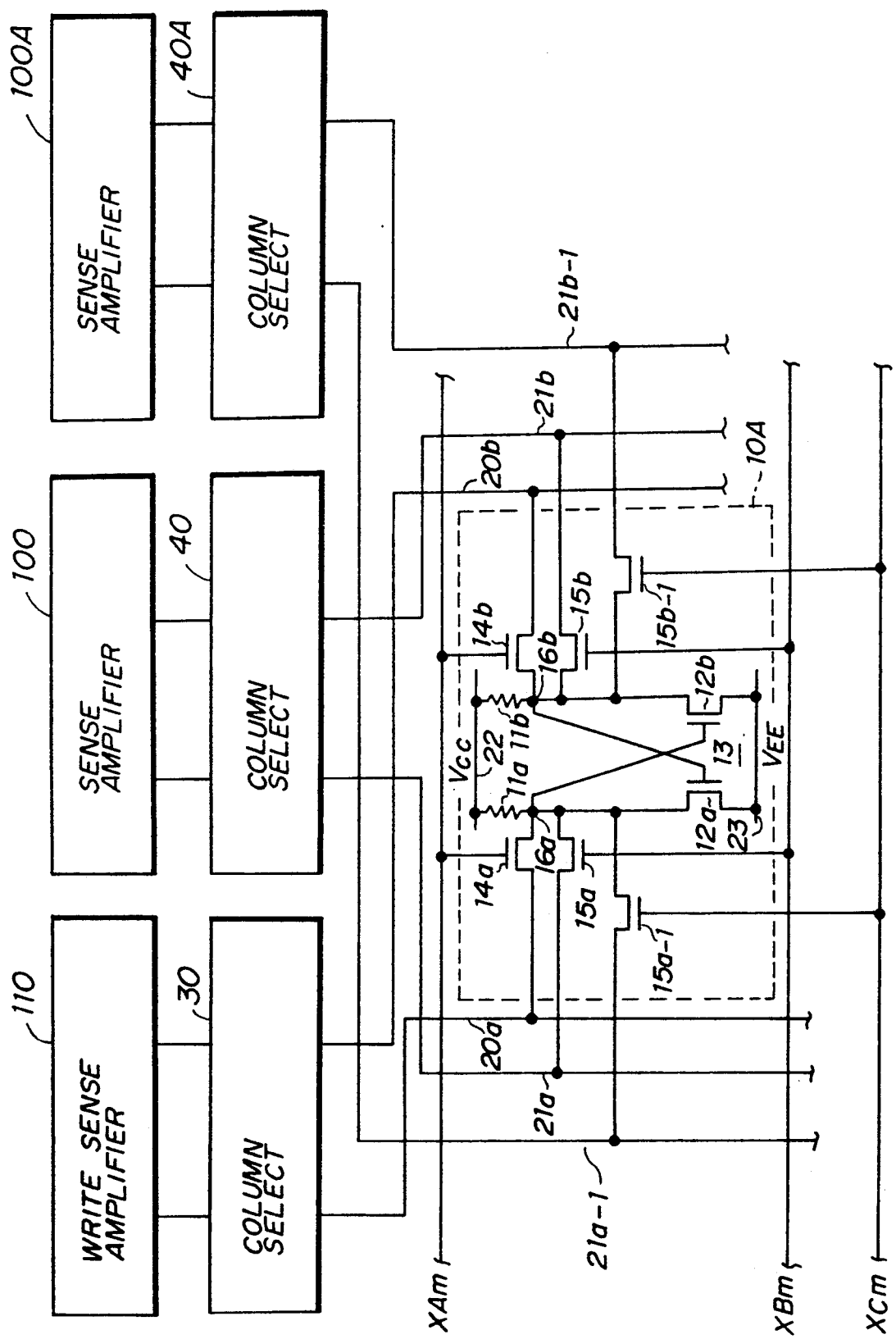

MULTI-PORT SEMICONDUCTOR MEMORY

BACKGROUND OF THE INVENTION

The present invention generally relates to a multi-port semiconductor memory, and more particularly, to a multi-port semiconductor memory which has at least one write/read port and at least one read port. More specifically, the present invention is directed to an improvement in a sense amplifier provided in a read system of such a multi-port semiconductor memory.

There is known a multi-port semiconductor memory having a BiCMOS structure. Bipolar transistors are used for forming a differential amplifier serving as a write sense amplifier provided in a write/read system and a differential amplifier serving as a read sense amplifier provided in a read system. CMOS transistors composed of p-channel insulated gate type field effect transistors (hereinafter simply referred to as pMOS transistors) and n-channel insulated gate type field effect transistors (hereinafter simply referred to as nMOS transistors) are used for forming circuits other than the above-mentioned differential circuits. Such a BiCMOS type semiconductor memory operates at a speed higher than that of a MOS type semiconductor memory in which all transistors are of the MOS type.

In a semiconductor memory having a write/read system and a read system as described above, there is a case where the read system is requested to read data which is to be written by the write/read system in the same cycle. That is, it is requested that the data writing to be carried out by the write/read system at the same time as the data reading by the read system.

However, a conventional multi-port semiconductor memory presents the following disadvantage. When the read system tries to read data which is to be written into a memory cell by the write/read system, the read system must wait for the completion of the data writing operation by the write/read system. That is, it is impossible for the read system to read the data before the next cycle starts. This prevents the speeding up of data processing.

SUMMARY OF THE INVENTION

It is a general object of the present invention to provide an improved multi-port semiconductor memory in which the above-mentioned disadvantage is eliminated.

A more specific object of the present invention is to provide a multi-port semiconductor memory in which the data reading by a read system can be carried out at the same time as the data writing by a write/read system so that an increased data processing speed can be obtained.

The above-mentioned objects of the present invention are achieved by a multi-port semiconductor memory comprising a memory cell array having a plurality of memory cells and having a plurality of columns and rows, and a write/read system having write sense amplifiers provided for the columns, each of the columns having a first pair of data lines, and each of the write sense amplifiers causing a voltage difference between the first pair of data lines when writing data into the memory cell array and sensing a voltage difference therebetween when reading data therefrom. The multi-port semiconductor memory also comprises at least one read system having sense amplifiers provided for the columns, each of said columns having a second pair of data lines, each of the sense amplifiers having first and second terminals connected to the second pair of data lines and sensing a voltage difference between the first and second terminals, first select means for selecting at least one of the columns and at least one of the rows related to the write/read system in response to a first address, and second select means for selecting at least one of the columns and at least one of the rows related to the read system in response to a second address. Further, the multi-port semiconductor memory comprises address coincidence detection means, coupled to the first and second select means, for generating a control signal when the first address provided for writing write data into the memory cell array by the write/read system coincides with the second address provided for reading the write data by the read system, and read control means, provided in each of the sense amplifiers of the read system, for connecting the first and second terminals of a corresponding one of the sense amplifies to the second pair of data lines when the address coincidence detection means generates no control signal and for setting one of the first and second terminals to a predetermined voltage on the basis of the content of the write data while the other one of the first and second terminals is connected to a corresponding one of the second pair of data lines.

BRIEF DESCRIPTION OF THE DRAWINGS

Other objects, features and advantages of the present invention will become more apparent from the following detailed description when read in conjunction with the accompanying drawings, in which:

FIG. 1 is a circuit, diagram of an essential part of a conventional multi-port semiconductor memory;

FIG. 9 is a block diagram illustrating an essential part of a multi-port semiconductor memory according to a third preferred embodiment of the present invention.

DESCRIPTION OF THE PREFERRED EMBODIMENTS

Figure 2A:
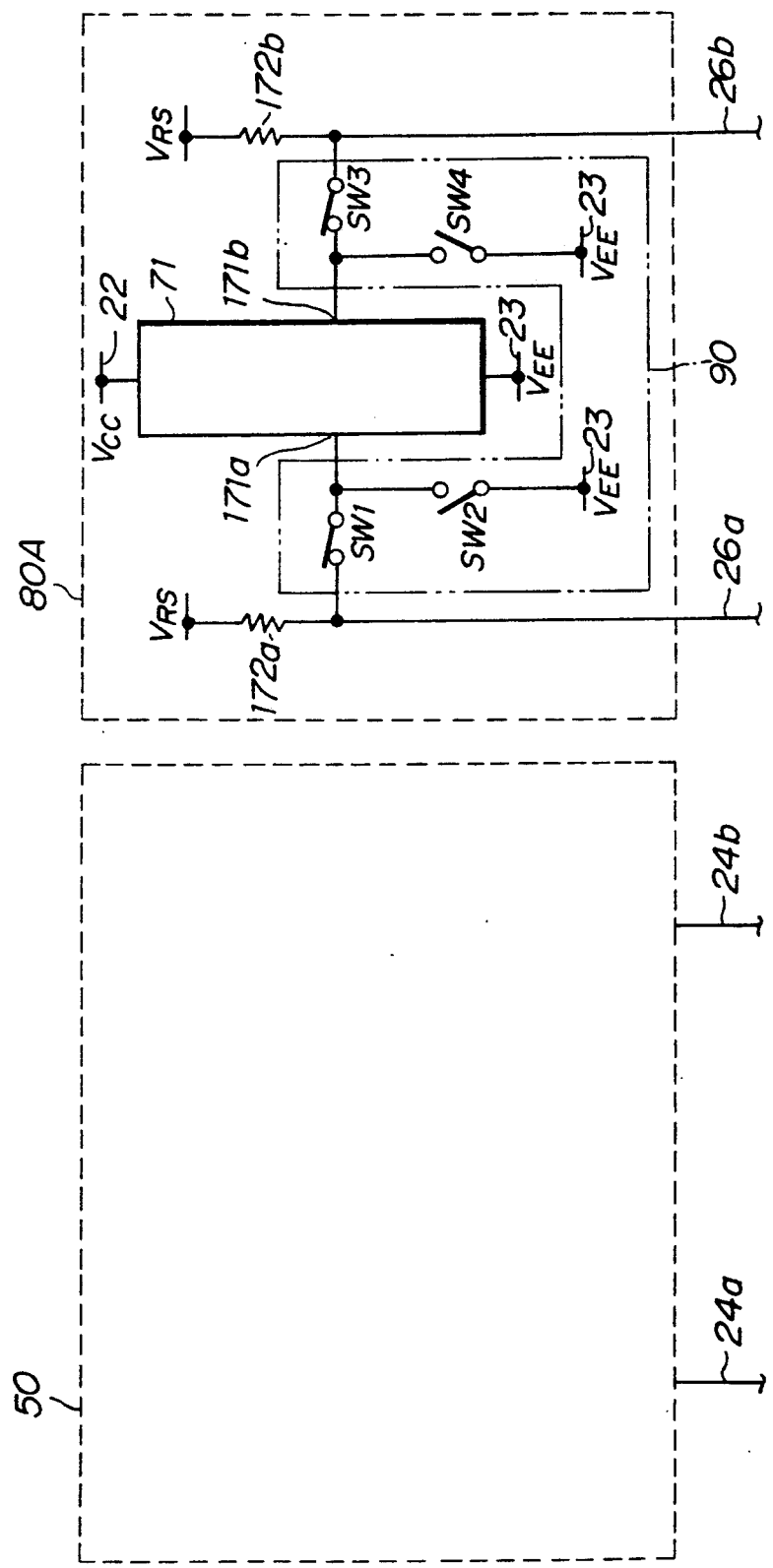
FIG. 2A and 2B are block diagrams illustrating the outline of a multi-port semiconductor memory according to the present invention.

In order to facilitate understanding of the present invention, a description will now be given of a conventional multi-port semiconductor memory with reference to FIG. 1.

Referring to FIG. 1, there is illustrated a conventional BiCMOS type multi-port semiconductor memory. The multi-port semiconductor memory shown in FIG. 1 is a static RAM and has one write/read system and one read system. The semiconductor memory has a memory cell 10, a write/read system word line XAm, a read system word line XBm, a pair of write/read system bit lines 20a and 20b, and a pair of read system bit lines 21a and 21b. Further, the semiconductor memory shown in FIG. 1 has a write/read system column select circuit 30, and a pair of write/read system common data lines 24a and 24b. The column select circuit 30 is provided for each pair of write/read system bit lines 21a and 21b. Further, the semiconductor memory has a column select signal input terminal 25 to which a column select signal YAm related to the write/read system is input. The column signal YAm is at a high ('H') level when it is not selected, and is at a low ('L') level when it is selected. Further, the semiconductor memory in FIG. 1 has a read system column select circuit 40 and a pair of read system common data lines 26a and 26b. The read system column select circuit 40 is provided for each pair of read system bit lines 21a and 21b. Further, the semiconductor memory has a column select signal input terminal 27 to which a column select signal YBm related to the read system is input. The column select signal YBm is at a high level when it is not selected, and at a low level when it is selected. Further, the semiconductor memory has a write sense amplifier 50 provided for the write/read system, a write control circuit 60 provided for the write/read system, and a sense amplifier 70 provided for the read system.

The memory cell 10 is composed of resistors 11a and 11b, a flip-flop composed of nMOS transistors 12a and 12b, write/read system transfer gates 14a and 14b formed of nMOS transistors, and read system transfer gates 15a and 15b formed of nMOS transistors. An end of each of the resistors 11a and 11b is connected to a high-voltage power supply line 22 having a high voltage $V_{CC}$ equal to, for example, zero volt. The source of each of the nMOS transistors 12a and 12b is connected to a low-voltage power supply line 23 having a low voltage $V_{EE}$ equal to, for example, −5 volts.

When the memory cell 10 is selected by the write/read system, the word line XAm is set to the high level. Thereby, the nMOS transistors 14a and 14b are turned ON, and terminals 16a and 16b of the flip-flop 13 become connected to the write/read system bit lines 20a and 20b, respectively. On the other hand, when the memory cell 10 is selected by the read system, the word line XBm is set to the high level. Thereby, the nMOS transistors 15a and 15b are turned ON, and the terminals 16a and 16b of the flip-flop 13 are connected to the read system bit lines 21a and 21b.

The write/read system column select circuit 30 is composed of pMOS transistors 31a, 31b, 33a and 33b, and nMOS transistors 32a and 32b. The pMOS transistor 31a and the nMOS transistor 32a are used for connecting the common data line 24a and the bit line 20a. The pMOS transistor 33a is used for connecting a constant-voltage power supply line 28 supplied with −1 volt ($=V_{RS}$ lower than $C_{CC}$) and the bit line 20a. The pMOS transistor 31b and the nMOS transistor 32b are used for connecting the common data line 24b and the bit line 20b. The pMOS transistor 33b is used for connecting the constant-voltage power supply line 28 and the bit line 20b.

When the column select signal YAm is at the high level, that is, the column select circuit 30 is not selected, the pMOS transistors 31a and 31b are OFF. In this case, the output of a NOR gate 66 which will be described later is changed to the low level. Thus, the nMOS transistors 32a and 32b are OFF, and the pMOS transistors 33a and 33b are ON. Thus, in this case, the common bit line 24a is not connected to the bit line 20a, and the common data line 24b is not connected to the bit line 20b. On the other hand, the constant-voltage power supply line 28 is connected to the bit lines 20a and 20b.

On the other hand, when the column select signal YAm is changed to the low level, that is, the column select circuit 30 is selected, the pMOS transistors 31a and 31b are turned ON. In this case, as will be described later, a low-active write enable signal WE is changed to the low level and the output of the NOR gate 66 is switched to the high level. Thus, the nMOS transistors 32a and 32b are turned ON, and the pMOS transistors 33a and 33b are turned OFF. Thus, in this case, the common bit lines 24a and 24b are connected to the bit lines 20a and 20b, respectively. The constant-voltage power supply line 28 is not connected to the bit lines 21a and 21b.

The nMOS transistor 32a functions to connect the common data line 24a and the bit line 20a in a situation where, during the write operation, the common data line 24a is at the low level and the pMOS transistor 31a is OFF. Similarly, the nMOS transistor 32b functions to connect the common data line 24b and the bit line 20b in a situation where, during the write operation, the common data line 24b is at the low level and the pMOS transistor 31b is OFF.

When the column select signal YAm is set to the low level to thereby select the column select circuit 30 and when the write enable signal WE is set to the high level so that the data read operation is instructed to be carried out, the output of the NOR gate 66 is set to the low level. Then, the pMOS transistors 31a, 31b, 33a and 33b are turned ON, and the nMOS transistors 32a and 32b are turned OFF. Thus, in this case, the common data lines 24a and 24b are connected to the bit lines 20a and 20b, respectively, and the constant-voltage power supply line 28 is connected to the bit lines 20a and 20b. By connecting the constant-voltage power supply line 28 to the bit lines 20a and 20b, it becomes possible to carry out the data read operation at a high speed.

The read system column select circuit 40 is composed of pMOS transistors 41a, 41b, 42a and 42b. The pMOS transistor 41a functions to connect the common data line 26a and the bit line 21a. The pMOS transistor 42a functions to connect the constant-voltage power supply line 28 and the bit line 21a. The pMOS transistor 41b functions to connect the common data line 26b and the bit line 21b. The pMOS transistor 42b functions to connect the constant-voltage power supply line 28 and the bit line 21b.

When the column select signal YBm is at the high level, that is, the column select circuit 40 is not selected, the pMOS transistors 41a and 41b are OFF. The pMOS transistors 42a and 42b are always ON because the gates of the pMOS transistors 42a and 42b are fixed at the low voltage $V_{EE}$. The common data line 26a is not connected to the bit line 21a, and the common data line 26b is not connected to the bit line 21b. On the other hand, the constant-voltage power supply line 28 is connected to the bit lines 21a and 21b via the pMOS transistors 42a and 42b, respectively.

On the other hand, when the column select signal YBm is changed to the low level to select the column select circuit 40, the pMOS transistors 41a and 41b are turned ON, and thus the common data lines 26a and 26b are connected to the bit lines 21a and 21b, respectively. At this time, the constant-voltage power supply line 28 is connected to the bit lines 21a and 21b. By always connecting the constant-voltage power supply line 28 to the bit lines 21a and 21b, it becomes possible to carry out the read operation at a higher speed.

The write sense amplifier 50 is composed of a differential circuit 51, a pMOS transistor 52a which is a load of the common data line 24a, a pMOS transistor 52b which is a load of the common data line 24b, and nMOS transistors 53a and 53b for use in the write operation. The differential circuit 51 is made up of resistors 54a and 54b, NPN transistors 55a and 55b, a constant current source 56, and data output terminals 57a and 57b through which data bits $\overline{D}_0$ and $D_0$ are output, respectively. An end of each of the resistors 54a and 54b is connected to the high-voltage power supply line 22. An end of the constant current source 56 is connected to the low-voltage power supply line 23.

The write control circuit 60 is made up of a data input terminal 61 to which write data $D_I$ is input, a write enable signal input terminal 62 to which the write enable signal WE is input, a buffer circuit 63, and NOR gates 64 and 65. As has been described previously, the write enable signal WE is at the low level during the write operation, and at the high level during the read operation.

During the write operation, that is, while the write enable signal WE is at the low level, if the write data $D_I$ is logic "0", that is, the write data $D_I$ is at the low level, a non-inverting output terminal of the buffer circuit 63 is at the low level. Thus, the output of the NOR gate 64 is set to the high level. Thus, the pMOS transistor 52a and the nMOS transistor 53a of the write sense amplifier 50 are OFF and ON, respectively. As a result, the common data line 24a is coupled to the low-voltage power supply line 23 via the nMOS transistor 53a and decreased to the low level ($V_{EE}$), and the column select circuit 30 is selected. When the gate of the pMOS transistor 31a is at the low level, the pMOS transistor 31a is OFF. However, in this case, since the nMOS transistor 32a is maintained in the ON state, the common data line 24a is definitely connected to the bit line 20a. Also, in this case, the output of an inverting output terminal of the buffer circuit 63 is at the high level, and the output of the NOR gate 65 is at the low level. Thus, the pMOS transistor 52b and the nMOS transistor 53b of the write sense amplifier 50 are ON and OFF, respectively. As a result, the common data line 24b is supplied with a constant voltage $V_{RS}$ via the pMOS transistor 52b.

During the write operation, when the memory cell 10 is selected and the write data $D_I$ having logic "0" is supplied, the gates of the nMOS transistors 12a and 12b are supplied with the high and low levels, respectively. Thus, the nMOS transistors 12a and 12b become ON and OFF, respectively. Then, the terminals 16a and 16b of the flip-flop 13 are set to the low level and high levels, respectively. Thus, logic "0" is written into the memory cell 10.

In this case, the voltage difference between the common data lines 24a and 24b is sensed by the differential circuit 51. Thus, the data output terminals 57a and 57b are at the high and low levels, respectively. Thus, logic "0" is read out from the memory cell 10.

When the write data $D_I$ has logic "1", that is, when it is at the high level, the common data line 24b is coupled to the low-voltage power supply line 23 via the nMOS transistor 53b, and is thus decreased to the low voltage $V_{EE}$. The common data line 24a is supplied with the constant voltage $V_{RS}$ via the pMOS transistor 52a. As a result, the gates of the nMOS transistors 12a and 12b of the memory cell 10 are supplied to the low and high levels, respectively, so that the nMOS transistors 12a and 12b become OFF and ON, respectively. Thus, the terminals 16a and 16b of the flip-flop 13 are set to the high and low levels, respectively, and data "1" is written into the memory cell 10. The data output terminals 57a and 57b are changed to the low and high levels, respectively, and data "1" is read out from the memory cell 10 by the write sense amplifier 50 at the same time as the above data "1" is written therein.

When the write/read system carries out the read operation, the write enable signal WE is set to the high level. In this case, the outputs of the NOR gates 64 and 65 are changed to the low level, so that the pMOS transistors 52a and 52b are ON and the nMOS transistors 53a and 53b are OFF. Also, in this case, when the column select circuit 30 is selected, the pMOS transistors 31a, 31b, 33a and 33b are ON, and the nMOS transistors 32a and 32b are OFF, as has been described previously.

For example, when the memory cell 10 is selected in the case where the memory cell 10 stores data "0", that is, the terminals 16a and 16b of the flip-flops 13 are at the low and high levels, respectively, a current passes through the pMOS transistors 52a and 31a and the nMOS transistors 14a and 12a. On the other hand, since the nMOS transistor 12b is OFF, no current passes through the nMOS transistor 14b. As a result, the voltage of the common data line 24a becomes lower than the voltage of the common data line 24b. This voltage difference is sensed by the differential circuit 51, and the data output terminals 57a and 57b are changed to the high and low levels, respectively. In this manner, data "0" is read out from the memory cell 10.

In the above-mentioned case, the constant-voltage power supply line 28 is connected to the bit line 20a via the pMOS transistor 33a, and a current is directed to the bit line 20a from the constant-voltage power supply line 28. This arrangement decreases the current which passes through the common data line 24a and reduces a voltage drop due to the existence of the pMOS transistor 52a. As a result, data can be read at a high speed. When data "1" is read out from the memory cell 10, a current is directed to the bit line 20b from the constant-voltage power supply line 28. Thus, the same operation as above is carried out.

The sense amplifier 70 is made up of a differential circuit 71 for sensing and amplifying data, a pMOS transistor 72a which serves as a load of the common data line 26a, and an pMOS transistor 72b which serves as a load of the common data line 26b. The differential circuit 71 is composed of resistors 73a and 73b, NPN transistors 74a and 74b, a constant current source 75, and data output terminals 76a and 76b. An end of each of the resistors 73a and 73b is connected to the high-voltage power supply line 22. An end of the constant current source 75 is connected to the low-voltage power supply line 23.

The gates of the pMOS transistors 72a and 72b are connected to the low-voltage power supply line 23 so that the pMOS transistors 72a and 72b are always ON. When the column select circuit 40 is selected, the pMOS transistors 41a and 41b are turned ON.

When the memory cell 10 which presently stores data "0" is selected, that is, when the terminals 16a and 16b of the flip-flop 13 are at the low and high levels, respectively, a current passes through the pMOS transistors 72a and 41a and the nMOS transistors 15a and 12a. On the other hand, since the nMOS transistor 12b is OFF, no current passes through the common data line 26b. As a result, the voltage of the common data line 26a becomes lower than that of the common data line 26b. This voltage difference is sensed by the differential circuit 71, and the data output terminals 76a and 76b are set to the high and low levels, respectively. In this manner, data "0" is read out from the memory cell 10.

When data "1" is read out from the memory cell 10, a current passes through the common data line 26b, and thus the voltage of the common data line 26b becomes lower than that of the common data line 26a. This voltage difference is sensed by the differential amplifier 71. As a result, the data output terminals 76a and 76b are set to the low and high levels, respectively, so that data "1" is read out from the memory cell 10.

In the read system, the constant-voltage power supply line 28 is connected to the bit lines 21a and 21b via the pMOS transistors 42a and 42b, respectively, so that a current is directed to the bit lines 21a and 21b from the constant-voltage power supply line 28. Thus, the currents passing through the common data lines 26a and 26b are reduced and the voltage drops occurring between the pMOS transistors 72a and 72b are decreased. As a result, it is possible to read out data from the memory cell 10 at a high speed.

In a semiconductor memory having a write/read system and a read system as described above, there is a case where the read system is requested to read data which is to be written by the write/read system in the same cycle. That is, the data writing by the write/read system is requested at the same time as the data reading by the read system.

However, the arrangement shown in FIG. 1 presents the following disadvantages in such an above case. When the sense amplifier 70 tries to read data which is to be written into the memory cell 10 by the write sense amplifier 50, the sense amplifier 70 must wait for the completion of the data writing operation by the write sense amplifier 50. That is, it is impossible for the sense amplifier 70 to read the data before the next cycle starts. This prevents the speeding up of data processing.

Figure 2B:
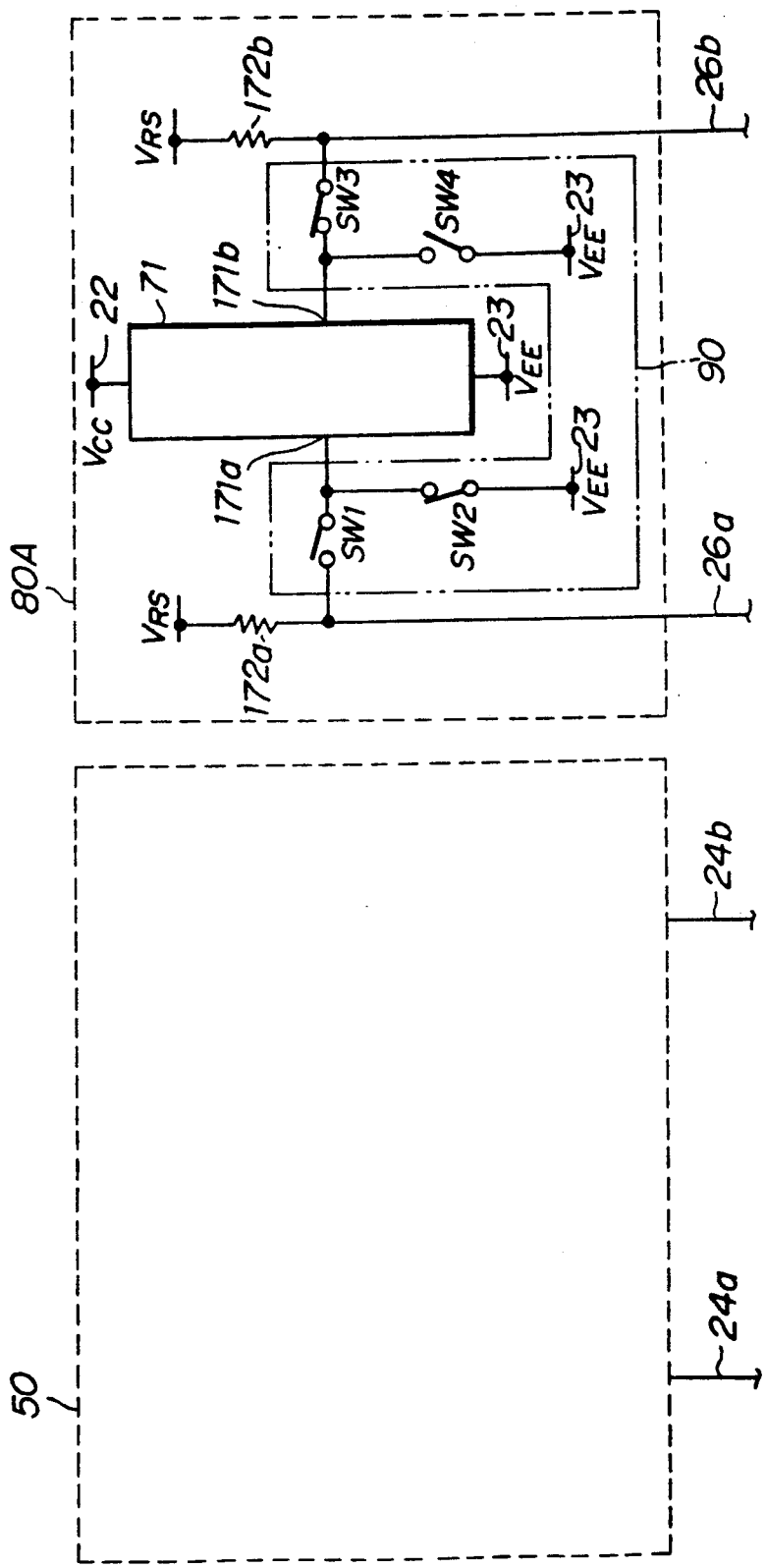

The present invention is directed to overcoming the above-mentioned disadvantage. Referring to FIGS. 2A and 2B, there is illustrated the outline of the present invention. In FIGS. 2A and 2B, those parts which are the same as those shown in FIG. 1 are given the same reference numerals. A multi-port semiconductor memory shown in FIGS. 2A and 2B includes a write/read system having the aforementioned write sense amplifier 50, and a read system having an improved sense amplifier 80A. The sense amplifier 80A is made up of the aforementioned differential circuit 71 and a read control circuit 90. The differential circuit 71 is connected between the high-voltage power supply line 22 and the low-voltage power supply line 23. The differential circuit 71 senses the voltage difference between the common data lines 26a and 26b and reads out data from a memory cell coupled to the common data lines 26a and 26b.

The read control circuit 90 is connected to the differential circuit 71 via input terminals 171a and 171b, and also connected to the common data lines 26a and 26b. The read control circuit 90 has four switches SW1, SW2, SW3 and SW4. The switch SW1 is provided between the common data line 26a and the input terminal 171a. The switch SW2 is provided between the input terminal 171a and the low-voltage power supply line 23. The switch SW3 is connected to the common data line 26b and the input terminal 171b. The switch SW4 is connected to the input terminal 171b and the low-voltage power supply line 23.

In cases other than a case where the read system having the sense amplifier 80A selects an address for reading data while this address is also selected by the write/read system having the write sense amplifier 50 in order to write data, the switches SW1 and SW3 are ON, and the switches SW2 and SW4 are OFF. That is, the differential circuit 71 is connected to the common data lines 26a and 26b when the write/read system and the read system respectively select the same address in order to read data, or when the write/read system and the read system select different addresses irrespective of whether data is read or written.

On the other hand, when the read system having the sense amplifier 80A selects an address for reading data while this address is also selected by the write/read system having the write sense amplifier 50 in order to write data, the switches SW1-SW4 are controlled based on the content of the write data $D_I$. More specifically, when the write data $D_I$ is logic "0", as shown in FIG. 2B, the input terminal 171a of the differential circuit 71 is electrically disconnected from the common data line 26a and electrically connected to the low-voltage power supply line 23. On the other hand, when the write data $D_I$ is logic "1", the input terminal 171b of the differential circuit 71 is electrically disconnected from the common data line 26b and electrically connected to the low-voltage power supply line 23 (this case is not illustrated). In the above-mentioned way, a voltage difference based on the content of the write data $D_I$ appears between the input terminals 171a and 171b. This voltage difference is sensed and amplified by the differential circuit 71.

The present invention is concerned with a multi-port semiconductor memory having at least one write/read system and at least one read system having the sense amplifier 80A including the read control circuit 90.

A description will now be given of a first preferred embodiment of the present invention with reference to FIG. 3, in which those parts which are the same as those shown in FIG. 1 are given the same reference numerals. The semiconductor memory shown in FIG. 3 includes a memory cell 10 which is in a memory cell array (which will be described later), the write/read system column select circuit 30, the read system column select circuit 40, the write sense amplifier 50, the write control circuit 60 and the sense amplifier 80A.

The sense amplifier 80A is composed of the differential circuit 71 for sensing data, the pMOS transistor 72a which serves as a load of the common data line 26a, the pMOS transistor 72b which serves as a load of the common data line 26b, and the read control circuit 90, as has been described previously. The control circuit 90 is composed of pMOS transistors 91a, 91b, 92a and 92b, nMOS transistors 93a, 93b, 94a and 94b, and a data through control signal input terminal 95 to which a data through control signal DT (which will be described in detail later) is applied.

The pMOS transistor 91a has a source connected to the common data line 26a, a drain connected to the base of the NPN transistor 74a, and a gate connected to the input terminal 95. The pMOS transistor 92a has a source connected to the common data line 26a, a drain connected to the base of the NPN transistor 74a, and a gate connected to the output terminal of the NOR gate 64.

The nMOS transistor 93a has a drain connected to the base of the NPN transistor 74a, a source connected to the drain of the nMOS transistor 94a, and a gate connected to the output terminal of the NOR gate 64. The nMOS transistor 94a has a source connected to the low-voltage power supply line 23 and a gate connected to the input terminal 95.

The pMOS transistor 91b has a source connected to the common data line 26b, a drain connected to the base of the NPN transistor 74b, and a gate connected to the input terminal 95. The pMOS transistor 92b has a source connected to the common data line 26b, a drain connected to the base of the NPN transistor 74b, and a gate connected to the output terminal of the NOR gate 65.

The nMOS transistor 93b has a drain connected to the base of the NPN transistor 74b, a source connected to the drain of the nMOS transistor 94b, and a gate connected to the NOR gate 65. The nMOS transistor 94b has a source connected to the low-voltage power supply line 23, and a gate connected to the input terminal 95.

The data through control signal DT has a low level in cases other than the case where an address selected for data writing by the write/read system is also selected for data reading by the read system. On the other hand, the data through control signal DT has a high level in the case where an address selected for data writing by the write/read system is also selected for data reading by the read system.

A description will now be given of the operation of the circuit shown in FIG. 3. When the data through control signal DT is at the low level, that is, in cases other than the case where the write/read system selects a write address which is also the read address selected by the read system, the pMOS transistors 91a and 91b are ON, and the nMOS transistors 94a and 94b are OFF. In such cases, the states of the pMOS transistor 92a and the nMOS transistor 93a are determined by the output signal of the NOR gate 64, and the states of the pMOS transistor 92b and the nMOS transistor 93b are determined by the output signal of the NOR gate 65. It will be noted that the states of the pMOS transistors 92a and 92b, and the nMOS transistors 93a and 93b do not influence the states of the pMOS transistors 91a and 91b and the states of the nMOS transistors 94a and 94b. Thus, when the sense amplifier 80A functions as the sense amplifier 80 shown in FIG. 1.

On the other hand, when the write enable signal WE changes to the low level so that the write/read system is switched to the write enable state and when the column select circuits 30 and 40 are selected so that the same memory cell 10 is selected, the data through control signal DT is changed to the high level. As a result, the pMOS transistors 91a and 91b are turned OFF, and the nMOS transistors 94a and 94b are turned ON.

Figure 4:
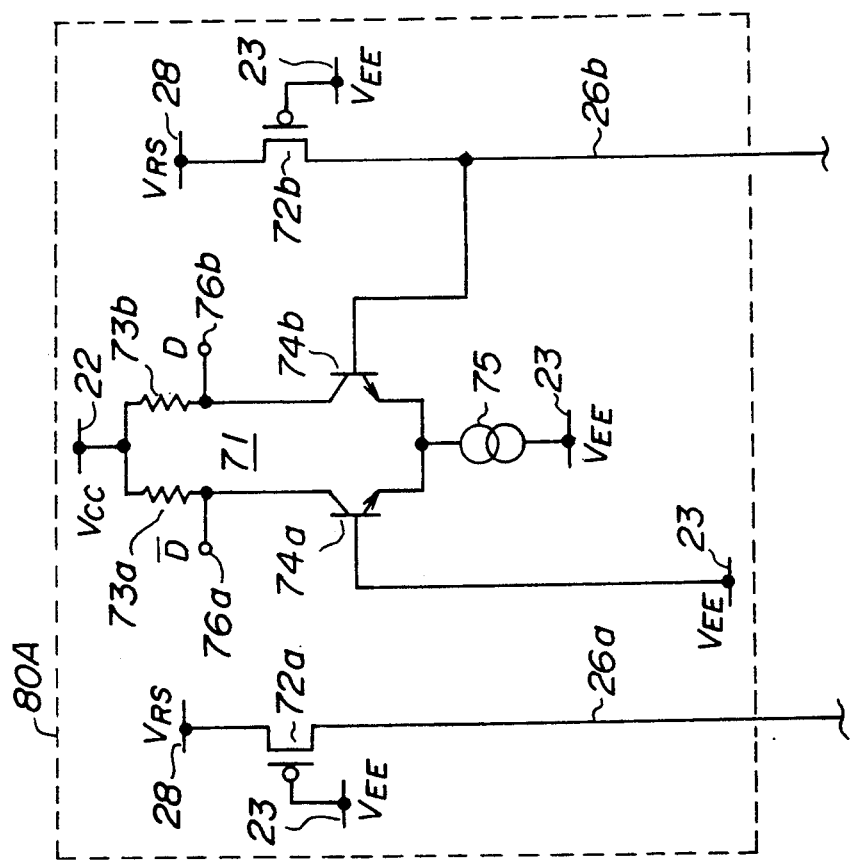
FIG. 4 is an equivalent circuit of a sense amplifier shown in FIG. 3.

At this time, if the write data $D_I$ having logic "0" (low level) is input to the data input terminal 61 of the write control circuit 60, the outputs of the NOR gates 64 and 65 are changed to the high and low levels, respectively. Thus, the pMOS transistor 92a and the nMOS transistor 93b are OFF, and the nMOS transistor 93a and the pMOS transistor 92b are ON. As a result, in this case, the sense amplifier 80A is substantially the same as a circuit shown in FIG. 4. That is, the base of the NPN transistor 74a which corresponds to the input terminal 171a shown in FIG. 2B is disconnected from the common data line 26a and connected to the low-voltage power supply line 23. On the other hand, the base of the NPN transistor 74b which corresponds to the input terminal 171b shown in FIG. 2B is connected to the common data line 26b. As a result, the base of the NPN transistor 74b is set approximately equal to the constant voltage $V_{RS}$.

Hence, the base voltage of the NPN transistor 74a becomes lower than the base voltage of the NPN transistor 74b, so that the data output terminals 76a and 76b output the high and low levels, respectively. Thus, logic "0" which is the write data $D_I$ is written into the memory cell 10 by the write sense amplifier 50 of the write/read system, and is also read out by the sense amplifier 80A of the read system in the same cycle.

When the write data $D_I$ input to the data input terminal 61 is logic "1", the base of the NPN transistor 74b is connected to the low-voltage power supply line 23, and thus the data output terminals 76a and 76b output the low and high levels, respectively. Thus, the write data "1" is read out at the same time as it is written into the memory cell 10.

According to the above-mentioned first preferred embodiment of the present invention, in cases other than a case where an address selected for data writing by the write/read system is also selected for data reading by the read system, the sense amplifier 80A operates in the same way as the sense amplifier 80. On the other hand, in the case where an address selected for data writing by the write/read system is also selected for data reading by the read system, the write data written into the memory cell 10 by the write sense amplifier 50 is also read out by the sense amplifier 80 within the same cycle. With this arrangement, it becomes possible to speed up data processing.

Figure 5:
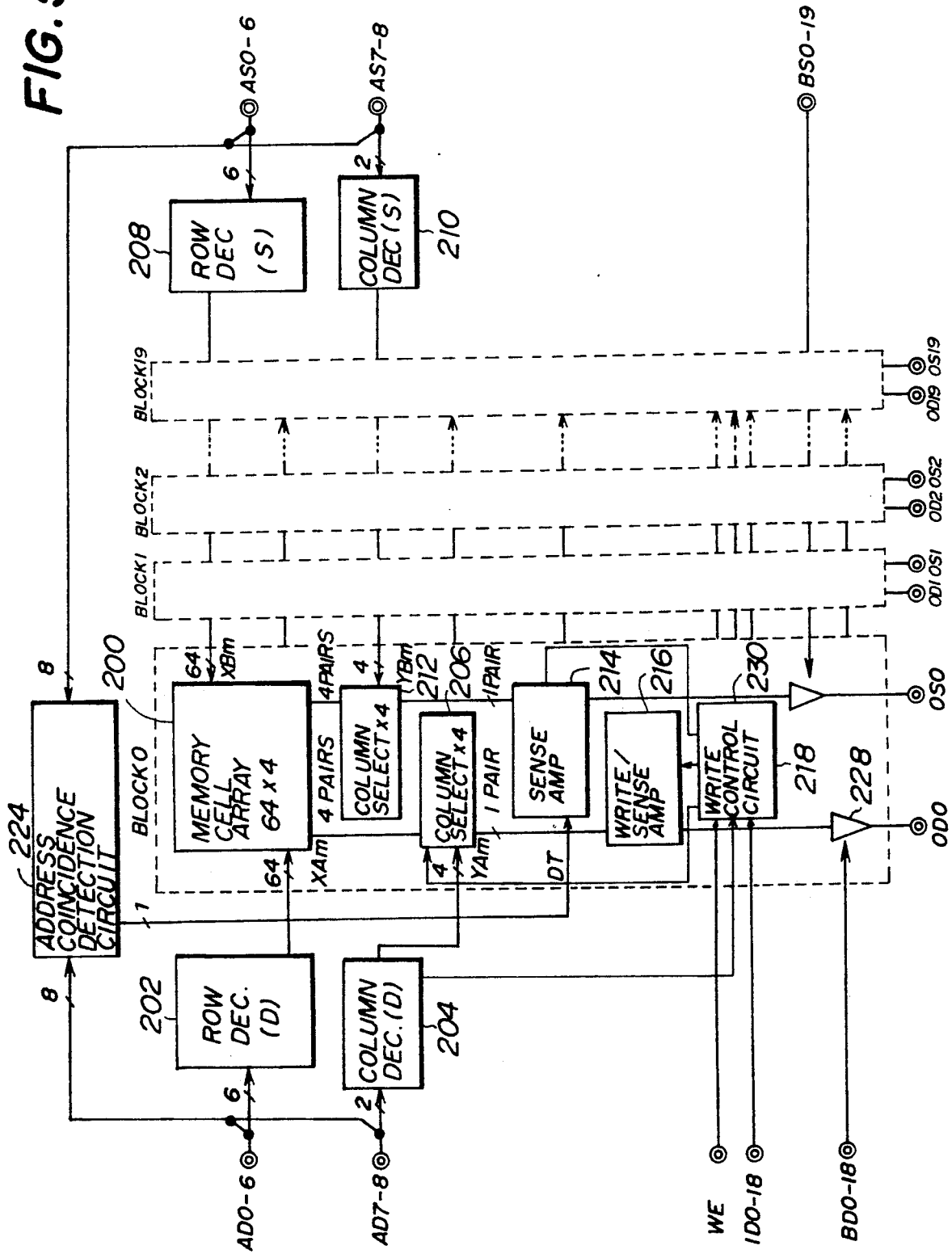
FIG. 5 is a block diagram illustrating the entire structure of the multi-port semiconductor memory according to the present invention.

FIG. 5 is a block diagram illustrating the entire structure of the multi-port semiconductor memory according to the present invention. The multi-port semiconductor memory shown in FIG. 5 includes a plurality of blocks BLOCK0-BLOCK19, a row decoder 202, a column decoder 204, a row decoder 208, a column decoder 210 and an address coincidence detection circuit 224. The row decoder 202 and the column decoder 204 are related to the write/read system (D), and the row decoder 208 and the column decoder 210 are related to the read system. The write/read system is supplied with a write/read system address AD, which is composed of address bits AD0 through AD8. The address bits AD0-AD6 are input to the row decoder 202, and the remaining address bits AD7 and AD8 are input to the column decoder 204. The write/read system address AD is also input to the address coincidence detection circuit 224. The row decoder 202 outputs a row select signal XAm for selecting one of 64 word lines. The column decoder 204 outputs a column select signal YAm for selecting one of four pairs of bit lines 20a and 20b. On the other hand, the read system(s) supplied with a read address AS, which is composed of address bits AS0 through AS8. The address bits AS-0-AS6 are input to the row decoder 208, and the remaining address bits AS7 and AS8 are input to the column decoder 210. The read system address AS is also input to the address coincidence detection circuit 224. The row decoder 208 outputs a row select signal XBm for selecting one of 64 word lines. The column decoder 210 outputs a column select signal YBm for selecting one of four pairs of bit lines 21a and 21b.

The configuration shown in FIG. 5 has 20 memory cell arrays 200 provided in the blocks BLOCK0 through BLOCK19. Each of the memory cell array 200 has 64×4 memory cells. Further, each of the blocks BLOCK0 through BLOCK19 includes a column select circuit 212, a column select circuit 206, a sense amplifier 214, a write/sense amplifier 216, a write circuit 218, and two output buffers 228 and 230. The column select circuit 206, the write/sense amplifier 216, the write circuit 218 and the output buffer 228 are related to the write/read system, and the column select circuit 212, the sense amplifier 214 and the output buffer 230 are related to the read system.

The column select circuit 206, which includes the column select circuit 30 (FIG. 3), selects one of the four pairs of bit lines 20a and 20b in response to the column select signal YAm generated and output by the column decoder 204. The write sense amplifier 216, which includes the write sense amplifier 50 (FIG. 3), senses the voltage difference between the selected pair of bit lines 20a and 20b. The output buffer 228 receives bit select signal composed of bits BD0-BD19 and outputs, as an output data bit OD0, data sensed by the write sense amplifier 216. The write control circuit 218, which corresponds to the combination of the write control circuit 60 (FIG. 3) and the NOR gate 66, receives the column select signal YAm, the write enable signal WE and data D composed of bits ID0-ID19 and outputs the aforementioned signals to the column select circuit 206, the write sense amplifier 216 and the sense amplifier 214.

The column select circuit 212, which includes the column select circuit 40 (FIG. 3), selects one of the four pairs of bit lines 21a and 21b in response to the column select signal YBm generated and output by the column decoder 210. The sense amplifier 214, which includes the sense amplifier 80A (FIG. 3), senses the voltage difference between the selected pair of bit lines 21a and 21b. The output buffer 230 receives a bit select signal composed of bits BS0-BS19 and outputs the sensed data as a data output bit DS0. The other blocks BLOCK1--BLOCK19 are configured and operate in the same way as the above-mentioned block BLOCK1.

The number of blocks is not limited to 20, and an arbitrary number of blocks equal to or more than 1 can be used.

Figure 6:
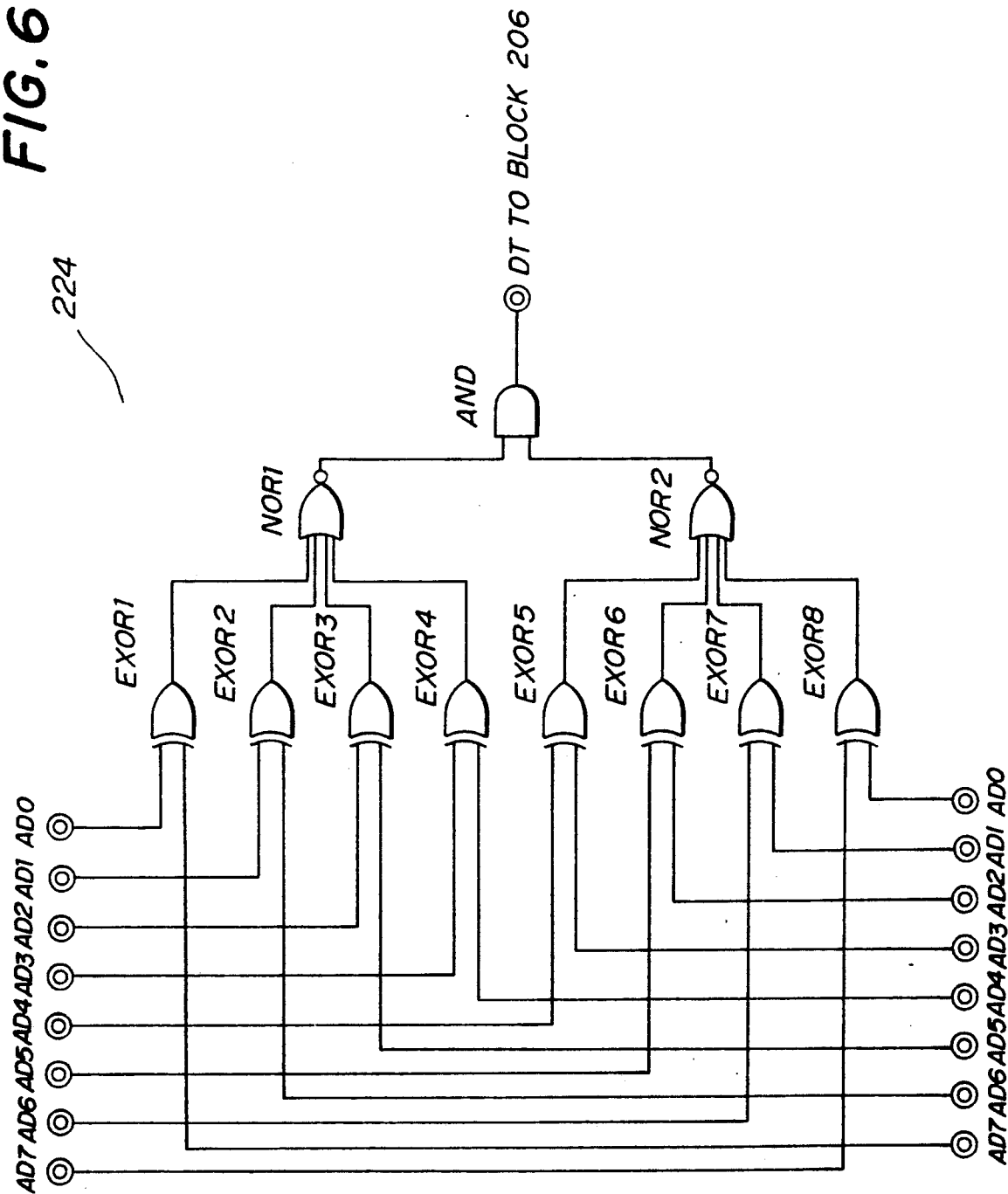
FIG. 6 is a circuit diagram of an address coincidence detection circuit shown in FIG. 5.

Referring to FIG. 6, there is illustrated the configuration of the address coincidence detection circuit 224 shown in FIG. 5. The circuit 224 is made up of eight exclusive-OR gates EXOR1 through EXOR8, two NOR gates NOR1 and NOR2 and an AND gate AND. The exclusive-OR gates EXOR1 through EXOR8 receive address bits AD0 through AD7 of the write/read system address AD and address bits AS0 through AS7 of the read system address AS, respectively. For example, as the address bit AD0 is the same as the address bit AS0, the exclusive-OR gate EXOR1 outputs a low-level output signal. The NOR gate NOR1 receives the output signals of the exclusive-OR gates EXOR1 through EXOR4, and the NOR gate NOR2 receives the output signals of the exclusive-OR gates EXOR5 through EXOR8. Output signals of the NOR1 and NOR2 are input to the AND gate AND, which outputs the high-level data through control DT when the write/read system address AD is exactly the same as the read system address AS.

Figure 7:
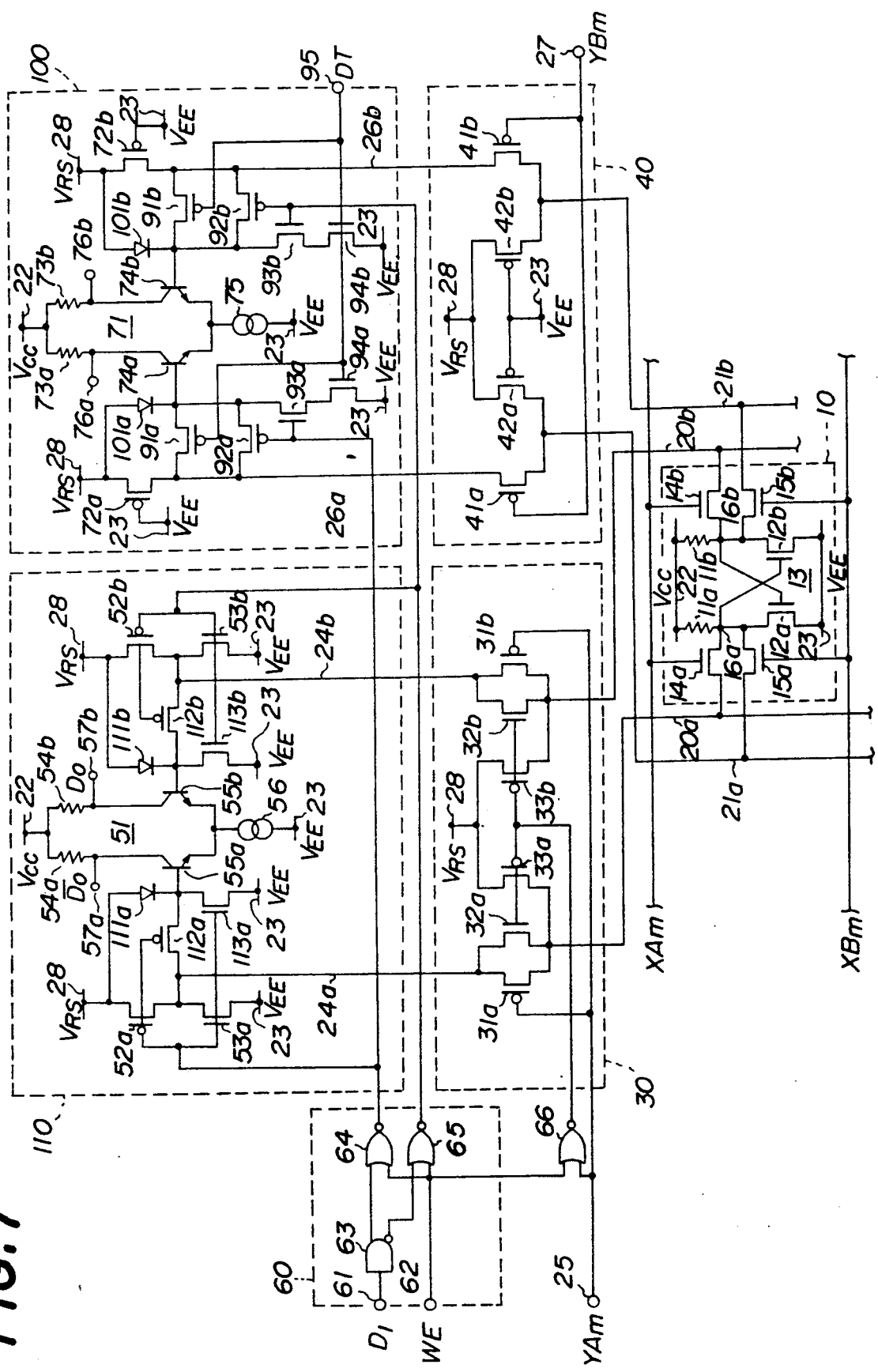
FIG. 7 is a circuit diagram of an essential part of a multi-port semiconductor memory according to a second preferred embodiment of the present invention.

A description will now be given of a second preferred embodiment of the present invention with reference to FIGS. 7 and 8. Referring to FIG. 7, a sense amplifier 100 and a write sense amplifier 110 are respectively substituted for the sense amplifier 80A and the write sense amplifier 50 shown in FIG. 3. Other structural elements of the second preferred embodiment of the present invention are the same as those of the first preferred embodiment of the present invention.

In the aforementioned first preferred embodiment of the present invention, in the case where the write data $D_I$ which is to be written into the memory cell 10 by the write sense amplifier 50 is read by the sense amplifier 80 within the same cycle, if the write data $D_I$ is logic "0", the base voltage of the NPN transistor 74a is set to the low voltage which is lower than the emitter voltage thereof. As a result, the NPN transistor 74a is set to a cutoff state. Hence, it takes a long time to restore the NPN transistor 74a from the cutoff state. This also holds true for the NPN transistor 74b.

In the case where the write sense amplifier 50 is in the write enable state, if the write data $D_I$ is logic "0", the base voltage of the NPN transistor 55a is set to the low voltage $V_{EE}$, which is lower than the emitter voltage thereof. Thus, the NPN transistor 55a is set to the cutoff state. Hence, it takes a long time to restore the NPN transistor 55a from the cutoff state. When logic "1" is to be written into the memory cell 10, the base voltage of the NPN transistor 55b is set to the base voltage $V_{EE}$. In this case, it takes a long time to restore the NPN transistor 55b from the cutoff state.

The second preferred embodiment of the present invention is directed to overcoming the above-mentioned disadvantages. The sense amplifier 100 has diodes 101a and 101b. The cathode and anode of the diode 101a are connected to the base of the NPN transistor 74a and the constant-voltage power supply line 28, respectively. The cathode and anode of the diode 101b are connected to the base of the NPN transistor 74b and the constant-voltage power supply line 28, respectively. Other arrangements of the sense amplifier 100 are the same as those of the sense amplifier 80A shown in FIG. 3.

When the write data $D_I$ having logic "0" is read out from the memory cell 10, that is, when the outputs of the NOR gates 64 and 65 are at the high and low levels, respectively, the base of the NPN transistor 74a is coupled to the low-voltage power supply line 23 via the nMOS transistors 93a and 94a. Thus, in this case, the sense amplifier 100 is substantially identical to a circuit shown in FIG. 8.

Figure 8:
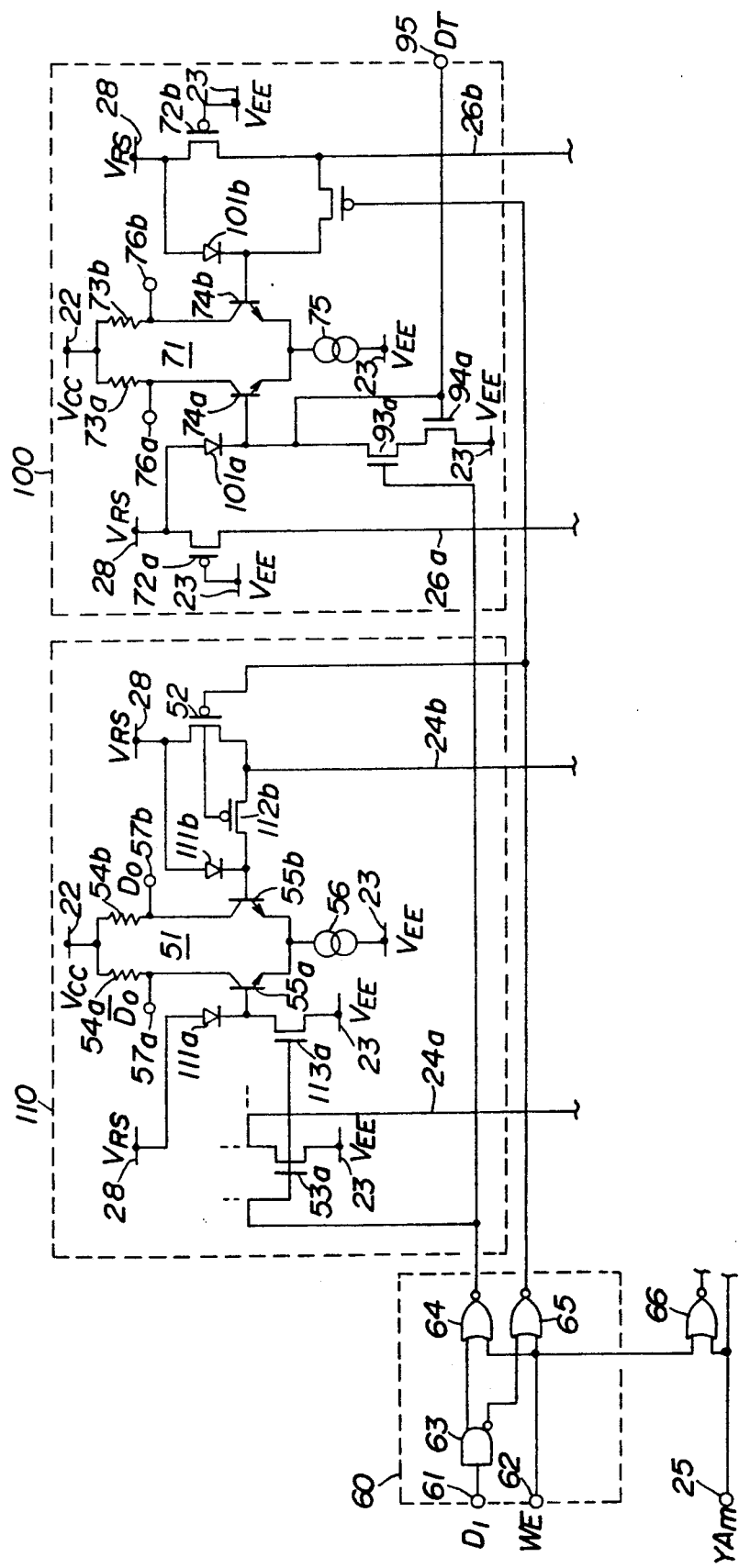
FIG. 8 is an equivalent circuit diagram of the circuit shown in FIG. 7.

Referring to FIG. 8, the diode 101a is forward connected between the constant-voltage power supply line 28 and the base of the NPN transistor 74a. Thus, the base voltage of the NPN transistor 74a is clamped at a voltage obtained by subtracting a forward voltage $V_F$ of the diode 101a from the constant voltage $V_{RS}$. As a result, it is possible to prevent the NPN transistor 74a from being set to the cutoff state. Also, in this case, the base voltage of the NPN transistor 74b is almost equal to the constant voltage $V_{RS}$, which is higher than the base voltage of the NPN transistor 74a. Thus, there is no influence on the data reading operation.

In the case where the base of the NPN transistor 74b is connected to the low-voltage power supply line 23, that is, the write data $D_I$ having logic "1" is read out, the NPN transistor 74b functions in the same way as the NPN transistor 74a.

The write sense amplifier 110 is made up of diodes 111a and 111b, pMOS transistors 112a and 112b, and nMOS transistors 113a and 113b. The diode 111a has an anode connected to the constant-voltage power supply line 28, and a cathode connected to the base of the NPN transistor 55a. The pMOS transistor 112a has a source connected to a connection node of the pMOS transistor 52a and the nMOS transistor 53a, a drain connected to the base of the NPN transistor 55a, and a gate connected to the output terminal of the NOR gate 64. The nMOS transistor 113a has a drain connected to the base of the NPN transistor 55a, a source connected to the low-voltage power supply line 23, and a gate connected to the output terminal of the NOR gate 64.

The diode 111b has an anode connected to the constant-voltage power supply line 28, and a cathode connected to the base of the NPN transistor 55b. The pMOS transistor 112b has a source connected to a connection node of the pMOS transistor 52b and the nMOS transistor 53b, a drain connected to the base of the NPN transistor 55b, and a gate connected to the output terminal of the NOR gate 65. The nMOS transistor 113b has a drain connected to the base of the NPN transistor 55b, a source connected to the low-voltage power supply line 23, and a gate connected to the output terminal of the NOR gate 65.

When data "0" is written and read out within the same cycle, that is, when the outputs of the NOR circuits 64 and 65 are at the high and low levels, respectively, the pMOS transistor 52a is turned OFF, and the nMOS transistor 53a is turned ON. Thus, the common data line 24a is set to the low voltage At this time, the pMOS transistor 112a is turned OFF, and the nMOS transistor 113a is turned ON. Thus, the base of the NPN transistor 55a is disconnected from the common data line 24a, and the base of the NPN transistor 55a is coupled to the low-voltage power supply line 23 via the nMOS transistor 113a. At this time, the sense amplifier 100 is substantially identical to the circuit shown in FIG. 8.

It can be seen from FIG. 8 that the diode 111a is forward connected between the constant-voltage power supply line 28 and the base of the NPN transistor 55a. Thus, the base of the NPN transistor 55a is clamped at a voltage obtained by subtracting the forward voltage $V_F$ of the diode 111a from the constant voltage $V_{RS}$. As a result, it becomes possible to prevent the NPN transistor 55a from being in the cutoff state.

On the other hand, the pMOS transistors 52b and 112b are ON, and the nMOS transistors 53b and 113b are OFF. Thus, the base of the NPN transistor 55b is coupled to the common data line 24b via the pMOS transistor 112b. The common data line 24b is supplied with the constant volta via the pMOS transistor 52b. In this manner, it is possible to write logic "0" into the memory cell 10, and at the same time, read the same through the differential circuit 51.

When the write data $D_J$ is logic "1", the base voltage of the NPN transistor 55a is set approximately equal to the constant volta and the base voltage of the NPN transistor 55b is clamped at a voltage obtained by subtracting the forward voltage $V_F$ of the diode 111b from the constant voltage $V_{RS}$. Similarly, it is possible to prevent the NPN transistor 55b from being set to the cutoff state.

The second preferred embodiment of the present invention also presents the aforementioned advantages presented by the first preferred embodiment of the present invention. In addition, according to the second embodiment of the present invention, it is possible to prevent the NPN transistors 74a and 74b of the differential circuit 71 in the sense amplifier 100 and the NPN transistors 55a and 55b of the differential circuit 51 in the write sense amplifier 110 from being set to the cutoff state. Thus, the second embodiment of the present invention operates at a speed higher than that of the first embodiment thereof.

FIG. 9 is a block diagram of a third preferred embodiment of the present invention. A multi-port semiconductor memory shown in FIG. 9 has one write/read system and two read systems. In FIG. 9, those parts which are the same as those shown in the previous figures are given the same reference numerals. The write/read system includes the write sense amplifier 110 and the column select circuit 30. One of the two read systems includes the sense amplifier 100 and the column select circuit 40. The other one of the two read systems includes a sense amplifier 100A and a column select circuit 40A, which are the same as the sense amplifier 100 and the column select circuit 40, respectively.

A memory cell 10A has two nMOS transistors 15a-1 and 15b-1 in addition to the structure shown in FIG. 7. Bit lines 21a-1 and 21b-1 extending from the column select circuit 40A are coupled to the input terminals 16a and 16b of the flip-flop 13 via the nMOS transistors 15a-1 and 15b-1, respectively. The gates of the nMOS transistors 15a-1 and 15b-1 are connected to a word line XCm for the read system including the sense amplifier 100A.

Figure 3:
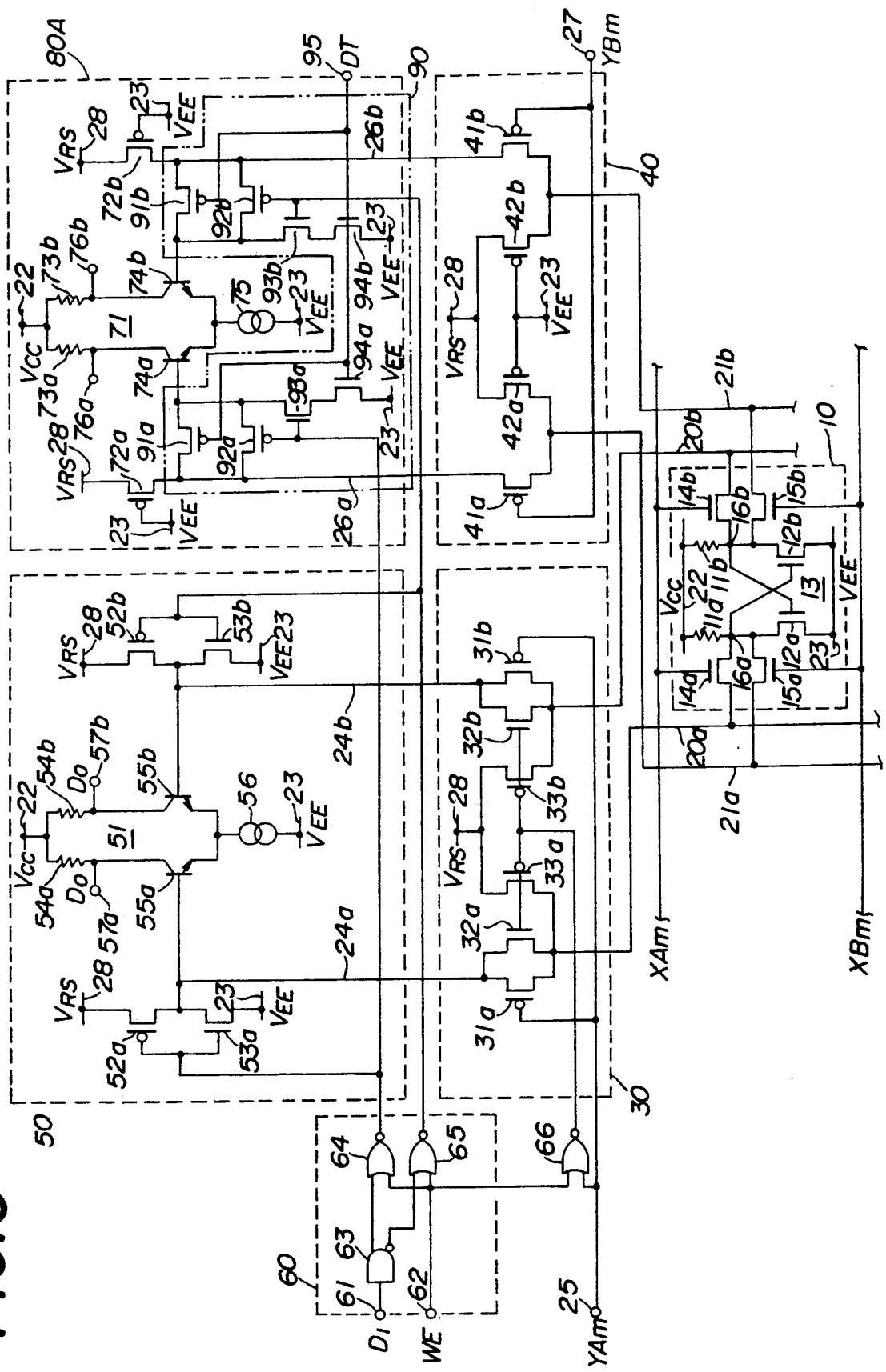
FIG. 3 is a circuit diagram of an essential part of a multi-port semiconductor memory according to a first preferred embodiment of the present invention.

It is also possible to replace the sense amplifier 100A by the sense amplifier 80A shown in FIG. 3 or the sense amplifier 70 shown in FIG. 1.

The present invention is not limited to the specifically disclosed embodiments, and variations and modifications may be made without departing from the scope of the present invention.

What is claimed is:

1. A multi-port semiconductor memory comprising:
   a memory cell array having a plurality of memory cells and having a plurality of columns and rows;
   a write/read system having write sense amplifiers provided for said columns, each of said columns having a first pair of data liens, and each of said write sense amplifiers causing a voltage difference between said first pair of data lines when writing data into said memory cell array and sensing a voltage difference therebetween when reading data therefrom;
   at least one read system having sense amplifiers provided for said columns, each of said column having a second pair of data lines, and each of said sense amplifiers having first and second terminals connected to said second pair of data lines and sensing a voltage difference between said first and second terminals;
   first select means for selecting at least one of the columns and at least one of the rows related to said write/read system in response to a first address;
   second select means for selecting at least one of the columns and at least one of the rows related to said read system in response to a second address;
   address coincidence detection means, coupled to said first and second select means, for generating a control signal when said first address provided for writing write data into said memory cell array by said write/read system coincides with said second address provided for reading said write data by said read system; and
   read control means, provided in each of said sense amplifiers of said read system, for connecting said first and second terminals of a corresponding one of the sense amplifiers to said second pair of data lines when said address coincidence detection means generates no control signal and for setting one of said first and second terminals to a first voltage on the basis of the content of said write data while the other one of said first and second terminals is set to a second voltage different from said first voltage when said address coincidence detection means generates said control signal.

2. A multi-port semiconductor memory as claimed in claim 1, wherein said read control means comprises:
first switch means for connecting said first terminal to said one of the second pair of data lines in accordance with said write data and said control signal;
second switch means for connecting said first terminal to a predetermined power supply line having said first voltage in accordance with said write data and said control signal;
third switch means for connecting said second terminal to the other one of the second pair of data lines in accordance with said write data and said control signal; and
fourth switch means for connecting said second terminal to said predetermined power supply line in accordance with said write data and said control signal.

3. A multi-port semiconductor memory as claimed in claim 2, wherein said first switch means comprises:
a first field effect transistor coupled between said one of the second pair of data lines and said first terminal and having a gate receiving said control signal; and
a second field effect transistor coupled between said one of the second pair of data lines and said first terminal and having a gate receiving said write data.

4. A multi-port semiconductor memory as claimed in claim 2, wherein said third switch means comprises:
a first field effect transistor coupled between the other one of the second pair of data lines and said second terminal and having a gate receiving said control signal; and
a second field effect transistor coupled between the other one of the second pair of data lines and said second terminal and having a gate receiving said write data.

5. A multi-port semiconductor memory as claimed in claim 2, wherein:
said second switch means comprises a first field effect transistor and a second field effect transistor connected in series between said first terminal and said predetermined power supply line;
said first field effect transistor has a gate receiving said write data; and
said second field effect transistor has a gate receiving said control signal.

6. A multi-port semiconductor memory as claimed in claim 2, wherein:
said fourth switch means comprises a first field effect transistor and a second field effect transistor connected in series between said second terminal and said predetermined power supply line;
said first field effect transistor has a gate receiving said write data; and
said second field effect transistor has a gate receiving said control signal.

7. A multi-port semiconductor memory as claimed in claim 1, wherein:

each of said sense amplifiers is connected between a high-voltage power supply line and a low-voltage power supply line;
said multi-port semiconductor memory further comprises first setting means for connecting one of the second pair of data lines to a constant-voltage power supply line having a predetermined constant potential, and second setting means for connecting the other one of the second pair of data lines to said constant-voltage power supply line; and
said predetermined constant potential is less than a potential of said high-voltage power supply line.

8. A multi-port semiconductor memory as claimed in claim 7, wherein each of said sense amplifiers includes a sense amplifier comprising:
a first diode having an anode connected to said constant-voltage power supply line, and a cathode connected to said first terminal of said sense amplifier; and
a second diode having an anode connected to said constant-voltage power supply line, and a cathode connected to said second terminal thereof.

9. A multi-port semiconductor memory as claimed in claim 8, wherein:
each of said sense amplifiers comprises a differential amplifier having a first bipolar transistor coupled between said high-voltage power supply line and said low-voltage power supply line, and a second bipolar transistor coupled between said high-voltage power supply line and said low-voltage power supply line;
said first bipolar transistor has a base which functions as said first terminal; and
said second bipolar transistor has a base which functions as said second terminal.

10. A multi-port semiconductor memory as claimed in claim 1, wherein each of said write sense amplifiers comprises a differential amplifier having a first bipolar transistor coupled between a high-voltage power supply line and a low-voltage power supply line, and a second bipolar transistor coupled between said high-voltage power supply line and said low-voltage power supply line;
said first bipolar transistor has a base connected to one of the first pair of data lines; and
said second bipolar transistor has a base connected to the other one of the first pair of data lines.

11. A multi-port semiconductor memory as claimed in claim 10, further comprising:
a first diode having an anode connected to a constant-voltage power supply line having said first voltage, and a cathode connected to the base of said first bipolar transistor; and
a second diode having an anode connected to said constant-voltage power supply line, and a cathode connected to the base of said second bipolar transistor.

12. A multi-port semiconductor memory as claimed in claim 1, wherein:
each of said first and second addresses is composed of a plurality of address bits, and
wherein said address coincidence detection means comprises:
exclusive-OR gate means for calculating an exclusive-OR operation between said first address and said second address for every address bit and for outputting a detection signal for every address bit when said first address coincides with said second address; and gate means for determining whether or not said detection signal is obtained for each of all the address bits.

13. A multi-port semiconductor memory as claimed in claim 1, wherein each of said memory cells is a static random access memory cell.

14. A multi-port semiconductor memory comprising:
a memory cell array having a plurality of memory cells and having a plurality of columns and rows;
a write/read system having write sense amplifiers provided for said columns, each of said columns having a first pair of data lines, and each of said write sense amplifiers causing a voltage difference between said first pair of data lines when writing data into said memory cell array and sensing a voltage difference therebetween when reading data therefrom;
a plurality of read systems, each having sense amplifiers provided for said columns, each of said columns having a second pair of data lines, each of said sense amplifiers having first and second terminals connected to said second pair of data lines and sensing a voltage difference between said first and second terminals;
first select means for selecting at least one of the columns and at least one of the rows related to said write/read system in response to a first address;
second select means for selecting at least one of the columns and at least one of the rows related to at least one of said read systems in response to a second address;
address coincidence detection means, coupled to said first and second select means, for generating a control signal when said first address provided for writing write data into said memory cell array by said write/red system coincides with said second address provided for reading said write data by said read system; and wherein said plurality of sense amplifies includes a sense amplifier which comprises read control means for connecting said first and second terminals of said sense amplifier to said second pair of data liens when said address coincidence detection means generates when said address coincidence detection means generates no control signal and for setting one of said first and second terminals to a first voltage on the basis of the content of said write data while the other one of said first and second terminals is set to a second voltage different from said first voltage when said address coincidence detection means generates said control signal.

15. A multi-port semiconductor memory as claimed in claim 14, wherein said read control means comprises:
first switch means for connecting said first terminal to said one of the second pair of data lines in accordance with said write data and said control signal;
second switch means for connecting said first terminal to a predetermined power supply lien having said first voltage in accordance with said write data and said control signal;
third switch means for connecting said second terminal to the other one of the second pair of data lines in accordance with said write data and said control signal; and
fourth switch means for connecting said second terminal to said predetermined power supply line in accordance with said write data and said control signal.

* * * * *

UNITED STATES PATENT AND TRADEMARK OFFICE
CERTIFICATE OF CORRECTION

PATENT NO. : 5,124,950

DATED : June 23, 1992

INVENTOR(S) : FUKUSHI, et al.

It is certified that error appears in the above-indentified patent and that said Letters Patent is hereby corrected as shown below:

TITLE Page - between "[22]" and "[51]" insert:
--[30], FOREIGN APPLICATION PRIORITY DATA

Sept. 20, 1989 [JP]............1-244556--.

Col. 1, line 32, delete "to".

Col. 3, line 34, change "volt" to --volts--;
line 56, change "$C_{CC}$" to --$V_{CC}$--.

Col. 6, line 50, change "an" to --a--.

Col. 10, line 55, change "system(s)" to --system (S) is--;.

Col. 12, line 11, after "voltage" insert --$V_{CC}$--.

Col. 13, line 27, after "voltage" insert --$V_{EE}$--;
line 49, change "volta" to --voltage $V_{RS}$--;
line 55, change "volta" to --voltage $V_{RS}$--.

Col. 18, line 2, change "write/red" to --write/read--;
line 9, change "liens" to --lines--;

UNITED STATES PATENT AND TRADEMARK OFFICE
CERTIFICATE OF CORRECTION

PATENT NO. : 5,124,950

DATED : June 23, 1992

INVENTOR(S) : FUKUSHI, et al.

It is certified that error appears in the above-indentified patent and that said Letters Patent is hereby corrected as shown below:

Col. 18,      line 10, after "generates" delete the rest of the line;
line 11, delete "detection means generates";
line 24, change "lien" to --line--.

Signed and Sealed this

Thirty-first Day of May, 1994

Attest:

BRUCE LEHMAN

Attesting Officer

Commissioner of Patents and Trademarks